(12) United States Patent
Lin et al.

(10) Patent No.: US 10,218,388 B2
(45) Date of Patent: Feb. 26, 2019

(54) TECHNIQUES FOR LOW COMPLEXITY SOFT DECODER FOR TURBO PRODUCT CODES

(71) Applicant: SK Hynix Inc., Gyeonggi-do (KR)

(72) Inventors: Yi-Min Lin, San Jose, CA (US); Aman Bhatia, Fremont, CA (US); Naveen Kumar, San Jose, CA (US); Johnson Yen, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 6 days.

(21) Appl. No.: 15/173,446

(22) Filed: Jun. 3, 2016

(65) Prior Publication Data

US 2017/0179980 A1  Jun. 22, 2017

Related U.S. Application Data

(60) Provisional application No. 62/269,615, filed on Dec. 18, 2015, provisional application No. 62/312,248, filed on Mar. 23, 2016.

(51) Int. Cl.
*H03M 13/29* (2006.01)
*G11C 29/52* (2006.01)
(Continued)

(52) U.S. Cl.
CPC ..... *H03M 13/2963* (2013.01); *G06F 11/1012* (2013.01); *G11C 29/52* (2013.01);
(Continued)

(58) Field of Classification Search
CPC ............. H03M 13/2957; H03M 13/29; H03M 13/1515; H03M 13/2909; H03M 13/2963;
(Continued)

(56) References Cited

U.S. PATENT DOCUMENTS 6,336,201 B1 *  1/2002  Geile ...................... G06F 17/14
                                                          714/755
6,516,443 B1 *  2/2003  Zook ................ G11B 20/10009
                                                          714/792
(Continued)

OTHER PUBLICATIONS

Lucas M.F. Harada et al. Titled, "Stochastic Chase Decoding of BCH Codes" AICT 2015 : The Eleventh Advanced International Conference on Telecommunications, Jun. 21, 2015, 3 pages.
(Continued)

*Primary Examiner* — Albert Decady
*Assistant Examiner* — Enam Ahmed
(74) *Attorney, Agent, or Firm* — Kilpatrick Townsend Stockton LLP

(57) ABSTRACT

Techniques are described for decoding a message. In one example, the techniques include obtaining a first message comprising a plurality of information bits and a plurality of parity bits, decoding the first message using an iterative decoding algorithm to generate a first bit sequence, generating a miscorrection metric based at least on the first bit sequence and one or more reliability values corresponding to one or more bits in the first message, determining whether a miscorrection happened in the decoder by comparing the miscorrection metric with a first threshold, and upon determining that a miscorrection did not happen, outputting the first bit sequence as a decoded message.

15 Claims, 12 Drawing Sheets

(51) Int. Cl.
*H03M 13/37* (2006.01)
*H03M 13/45* (2006.01)
*H03M 13/00* (2006.01)
*G06F 11/10* (2006.01)
*H03M 13/11* (2006.01)
*H03M 13/15* (2006.01)
*G11C 29/04* (2006.01)
*G11C 29/36* (2006.01)

(52) U.S. Cl.
CPC ... *H03M 13/2909* (2013.01); *H03M 13/2948* (2013.01); *H03M 13/2975* (2013.01); *H03M 13/3738* (2013.01); *H03M 13/451* (2013.01); *H03M 13/6561* (2013.01); *G11C 2029/0409* (2013.01); *G11C 2029/0411* (2013.01); *G11C 2029/3602* (2013.01); *H03M 13/1102* (2013.01); *H03M 13/152* (2013.01); *H03M 13/1515* (2013.01); *H03M 13/2918* (2013.01); *H03M 13/2957* (2013.01)

(58) Field of Classification Search
CPC ......... H03M 13/6561; H03M 13/2948; H03M 13/3738; H03M 13/451; H03M 13/2975; H03M 13/1102; H03M 13/2918; H03M 13/152; G11B 20/1833; G06F 11/1012; G11C 29/52; G11C 2029/0409; G11C 2029/0411; G11C 2029/3602
USPC .......................................................... 714/755
See application file for complete search history.

(56) References Cited

U.S. PATENT DOCUMENTS

| 7,127,664 | B2* | 10/2006 | Nicol | H03M 13/2957 |
| | | | | 714/792 |
| 8,028,216 | B1* | 9/2011 | Yeo | H03M 5/145 |
| | | | | 714/755 |
| 8,832,524 | B2* | 9/2014 | Bennett | G06F 11/1076 |
| | | | | 714/752 |
| 8,850,298 | B2 | 9/2014 | Wu | |
| 8,854,753 | B2* | 10/2014 | Tan | G11B 20/10314 |
| | | | | 360/25 |
| 9,214,964 | B1* | 12/2015 | Varnica | H03M 13/2909 |
| 9,231,623 | B1 | 1/2016 | Kumar et al. | |
| 9,294,205 | B1* | 3/2016 | Harvey | G01R 1/071 |
| 9,559,727 | B1 | 1/2017 | Kumar et al. | |
| 9,998,148 | B2 | 6/2018 | Lin | |
| 2004/0019842 | A1 | 1/2004 | Argon | |
| 2008/0065970 | A1* | 3/2008 | Tan | G11B 20/1833 |
| | | | | 714/800 |
| 2008/0253207 | A1* | 10/2008 | Corcelli | G11C 29/02 |
| | | | | 365/201 |
| 2014/0006896 | A1* | 1/2014 | Wu | H03M 13/453 |
| | | | | 714/755 |
| 2014/0068395 | A1* | 3/2014 | Zhang | G11B 20/10268 |
| | | | | 714/799 |
| 2014/0351672 | A1 | 11/2014 | Marrow | |
| 2015/0149873 | A1 | 5/2015 | Cai | |
| 2015/0333776 | A1 | 11/2015 | Bolotov | |
| 2016/0013814 | A1* | 1/2016 | Cideciyan | H03M 13/2909 |
| | | | | 714/755 |

OTHER PUBLICATIONS

A. Mahran et al. Titled, "Adaptive application of the Chase algorithm on Reed-Solomon product codes" Personal Mobile Communication Conference, 2003. 5th European (Conf. Publ. No. 492), Apr. 22-25, 2003, 5 pages.

Phong S. Nguyen et al. Titled, "A Rate-Distortion Perspective on Multiple Decoding Attempts for Reed-Solomon Codes", Jun. 4, 2010, 5 pages.

Thierry Goubier et al. Titled, "Fine Grain Parallel Decoding of Turbo Product Codes: Algorithm and Architecture", IEEE Sep. 1, 2008, 6 pages.

* cited by examiner

TECHNIQUES FOR LOW COMPLEXITY SOFT DECODER FOR TURBO PRODUCT CODES

CROSS-REFERENCE TO RELATED APPLICATIONS

The present application claims priority to Provisional Application No. 62/269,615 entitled "Low Complexity TPC Soft Decoder Based On Modified Chase Decoding," Filed Dec. 18, 2015, and Provisional Application No. 62/312,248 entitled "Performance Optimization In Soft Decoding For Turbo Product Codes," filed Mar. 23, 2016, both of which are assigned to the assignee hereof and expressly incorporated by reference herein in its entirety.

TECHNICAL FIELD

The present disclosure relates generally to error correcting codes, and in particular, to an efficient decoder for Turbo Product Codes.

BACKGROUND

Reliability of storage systems such as NAND flash memories may decline as higher storage density is achieved with multi-level cell (MLC)/triple-level cell (TLC) technology. Error correcting codes (ECC) can be used in storage systems to detect and/or correct errors in the data and increase performance and efficiency of these systems. Several classes of ECC codes exist in the art, such as Bose-Chaudhuri-Hocquenghem (BCH) codes, low density parity check codes (LDPC), turbo product codes (TPC) and the like.

Soft decoding algorithms for ECC usually have higher performance compared to hard-decoding algorithms. However, hardware complexity of soft decoders is usually much higher than hardware complexity of hard decoding ECC decoders. There is a need in the art for efficient low complexity soft decoders for decoding ECC codes.

SUMMARY

In one example, a method for decoding is disclosed. The method includes, in part, obtaining a first message comprising a plurality of information bits and a plurality of parity bits, decoding the first message using an iterative decoding algorithm to generate a first bit sequence, generating a miscorrection metric based at least on the first bit sequence and one or more reliability values corresponding to one or more bits in the first message, determining whether a miscorrection happened in the decoder by comparing the miscorrection metric with a first threshold, and upon determining that a miscorrection did not happen, outputting the first bit sequence as a decoded message.

In one example, decoding the first message includes, in part, selecting a first set of least reliable bits from the first message by comparing one or more reliability values corresponding to one or more bits in the first message with a first reliability threshold, generating one or more bit flipping patterns based on the first set of least reliable bits, and generating the first bit sequence using the first message and the one or more bit flipping patterns.

In one example, the method further includes selecting a second set of least reliable bits by comparing the one or more reliability values with a second reliability threshold if a number of bits in the first set of least reliable bits is smaller than a predefined value. The second threshold may be greater than the first threshold.

In one example, each bit flipping pattern may include a maximum number of flipped bits which is smaller than a number of least reliable bits in the codeword.

In one example, determining whether the miscorrection happened in the decoder includes, in part, comparing the miscorrection metric with the first threshold if an iteration number is less than a predetermined number, and comparing the miscorrection metric with a second threshold if the iteration number is equal or greater than the predetermined number. In one example, the second threshold is less than the first threshold.

In one example, the first message corresponds to a turbo product code (TPC) codeword comprising two or more constituent codes, wherein each constituent code corresponds to a class of error correcting codes.

In one example, an apparatus for decoding is disclosed. The apparatus includes a memory and at least one processor coupled to the memory. The at least one processor is configured to obtain a first message comprising a plurality of information bits and a plurality of parity bits, decode the first message using an iterative decoding algorithm to generate a first bit sequence, generate a miscorrection metric based at least on the first bit sequence and one or more reliability values corresponding to one or more bits in the first message, determine whether a miscorrection happened in the decoder by comparing the miscorrection metric with a first threshold, and upon determining that a miscorrection did not happen, output the first bit sequence as a decoded message.

In one example, a non-transitory processor-readable medium for decoding is disclosed. The non-transitory processor-readable medium includes, in part, processor-readable instructions configured to cause one or more processors to obtain a first message comprising a plurality of information bits and a plurality of parity bits, decode the first message using an iterative decoding algorithm to generate a first bit sequence, generate a miscorrection metric based at least on the first bit sequence and one or more reliability values corresponding to one or more bits in the first message, and determine whether a miscorrection happened in the decoder by comparing the miscorrection metric with a first threshold, and upon determining that a miscorrection did not happen, output the first bit sequence as a decoded message.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The term "error correcting code (ECC)" is used herein to refer to a codeword that is generated by a process of adding redundant data, or parity data, to a message, such that it can be recovered by a receiver even when a number of errors are introduced, either during the process of transmission, or storage. In general, ECC decoding can correct one or more errors up to the capability of the code being used. Error-correcting codes are frequently used in communications, as well as for reliable storage in media such as CDs, DVDs, hard disks, and random access memories (RAMs), flash memories and the like. Error correcting codes may include turbo product codes (TPC), Low density parity check codes, Bose-Chaudhuri-Hocquenghem (BCH) codes, Reed Solomon codes, and the like.

Turbo product codes (TPC) may have two or more dimensions. Each dimension may correspond to a class of error correcting codes, which is referred to herein as constituent codes. As an example, a two-dimensional TPC codeword may include multiple error correcting codewords (hereinafter referred to as row codewords) corresponding to its first dimension, and multiple error correcting codewords (hereinafter referred to as column codewords) corresponding to its second dimension. Each of the row and/or column codewords may include BCH codes, Reed Solomon codes, or the like.

In general, TPC decoding is an iterative decoding among different dimension error correcting codewords. As an example, if BCH codes are used as constituent codes for each dimension of TPC codes, the TPC decoder performs BCH decoding on multiple row codewords and multiple column codewords of the TPC code. In one embodiment, a low complexity soft decoder architecture for TPC codes is disclosed. In one embodiment, soft decoding architecture presented herein may be used for decoding information obtained read from NAND memories by generating soft information using several NAND read operations.

Figure 1:
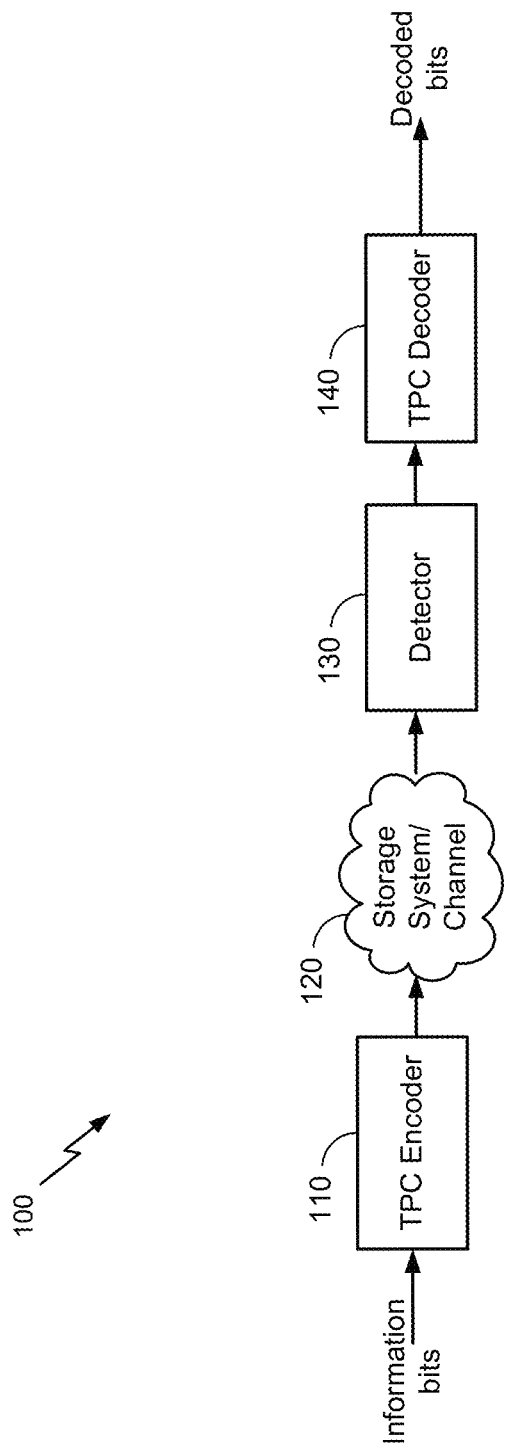
FIG. 1 illustrates an example high level block diagram of a turbo product code (TPC) error correcting system, in accordance with certain embodiments of the present disclosure.

FIG. 1 illustrates an example high level block diagram of a TPC error correcting system, in accordance with certain embodiments of the present disclosure. In the example shown, TPC encoder 110 receives information bits that include data which is desired to be stored in a storage system 120 or transmitted in a communications channel. TPC encoded data is output by TPC encoder 110 and is written to storage 120. In various embodiments, storage 120 may include a variety of storage types or media such as (e.g., magnetic) disk drive storage, Flash storage, etc. In some embodiments, the techniques described herein are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to TPC decoder 140 which performs TPC decoding using the decision and/or reliability information. A soft input decoder utilizes both the decision and the reliability information to decode the codeword. A hard decoder utilizes only the decision values in the decoder to decode the codeword. After decoding, the decoded bits generated by TPC decoder are passed to the appropriate entity (e.g., the user or application which requested it). With proper encoding and decoding, the information bits match the decoded bits.

Figure 2:
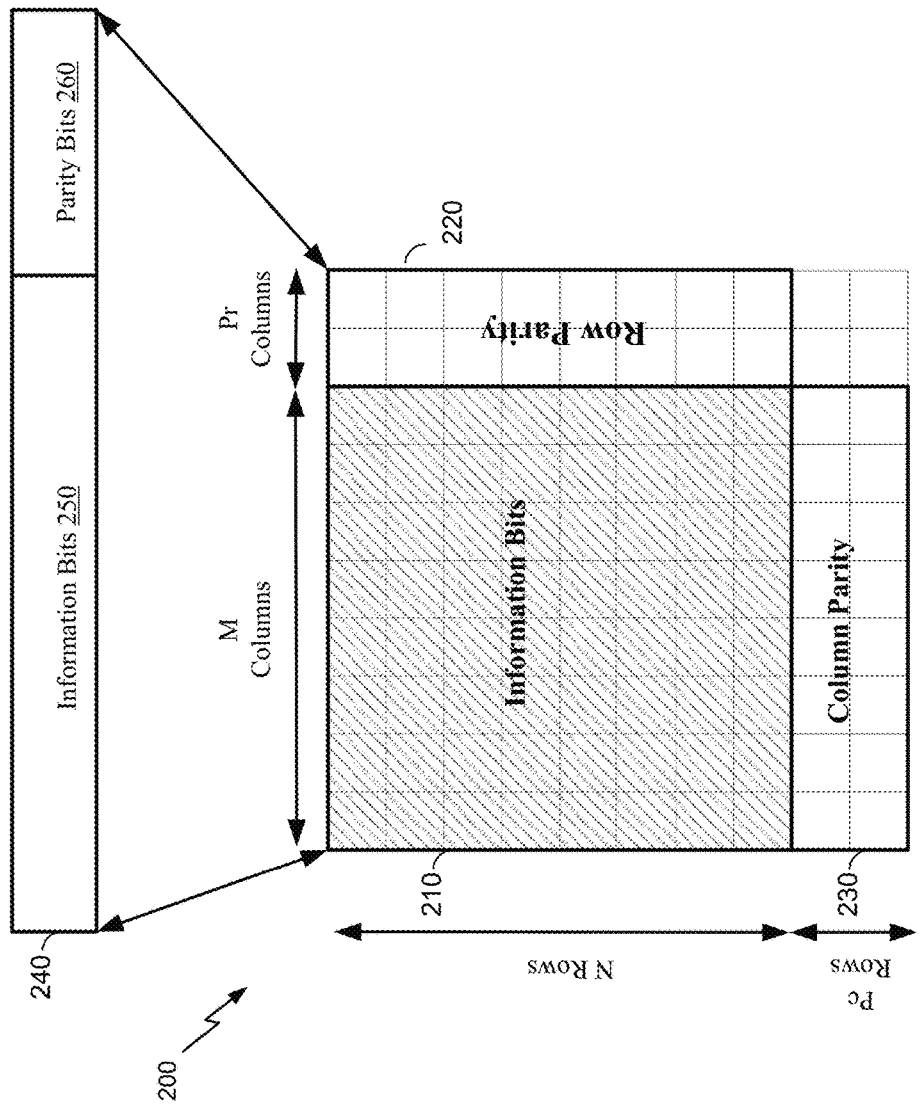
FIG. 2 illustrates an example block diagram of a TPC codeword, in accordance with certain embodiments of the present disclosure.

FIG. 2 illustrates an example block diagram of a two-dimensional TPC codeword 200, in accordance with certain embodiments of the present disclosure. As illustrated, the TPC codeword 200 may be a matrix of size $(N+P_c) \times (M+P_r)$, in which N represents number of rows of information bits, M represents number of columns of information bits, $P_r$ represents number of row parity bits and $P_c$ represents number of column parity bits. Information bits can be represented by a matrix of size N×M (e.g., matrix 210), row parity bits can be represented by a matrix of size $N \times P_r$ (e.g., matrix 220), and column parity bits may be represented by a matrix of size $P_c \times M$ (e.g., matrix 230). The TPC codeword may include N row codewords and M column codewords. Each row codeword 240 includes multiple information bits 250 and one or more parity bits 260. Similarly, each column codeword includes multiple information bits and one or more parity bits. As an example, if row constituent code is a BCH code, the row codewords 1 through N are constructed using BCH encoding. Similarly, column codewords 1 through M are generated using an error correcting constituent code (e.g., BCH code, Reed Solomon code, etc.).

As an example, if the row constituent code has a code rate of 0.9, the row codeword may include 90 information bits and 10 parity bits. In general, row codewords and column codewords may have any code rate, without departing from the teachings of the present disclosure. To obtain the row and column parity bits, a TPC encoder (not shown) first encodes the N rows of information bits (shown as shaded blocks) to generate the N row parity bit groups. Then, the TPC encoder encodes the M columns of information bits to generate the M column parity bit sets.

Figure 3:
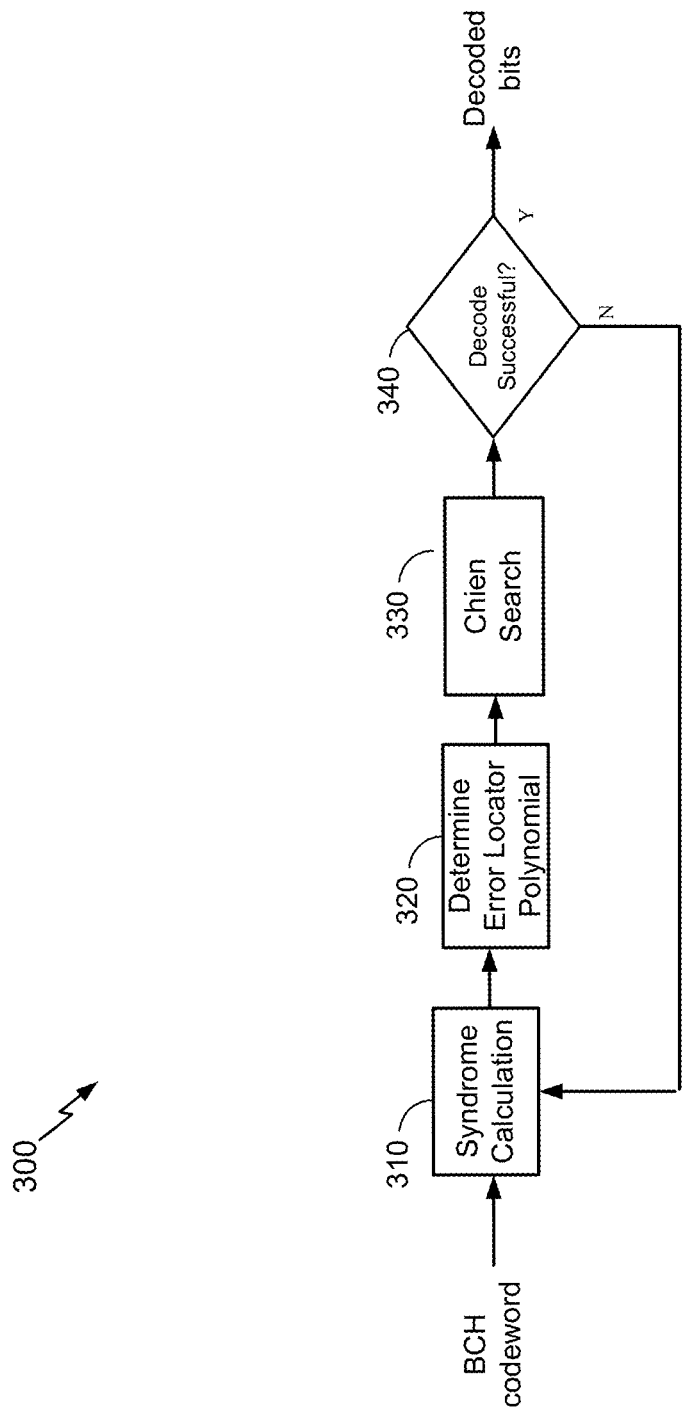
FIG. 3 illustrates an example Bose-Chaudhuri-Hocquenghem (BCH) decoder, in accordance with certain embodiments of the present disclosure.

FIG. 3 illustrates a high-level diagram of an example BCH decoder 300, in accordance with certain embodiments of the present disclosure. As illustrated, the decoder receives a BCH codeword and starts an iterative decoding process. For each iteration, BCH decoder performs syndrome calculation (step 310) on the received codeword, determines error locator polynomial (step 320), and performs Chien search or similar procedures to determine roots of error locator polynomial (step 330). Roots of the error locator polynomial provide an indication of where the errors in the codeword are located.

After correcting the errors, at 340, the decoder checks if the decoding process has resulted in a correct codeword. If yes, the decoder outputs the decoded bits. If not, the decoder may generate a bit flipping pattern, flip one or more bits of the codeword based on the pattern and calculate syndrome values of the new codeword. The decoding process may continue until a correct codeword is found and/or a predetermined maximum number of iterations is reached.

In BCH decoding, syndrome values are usually calculated after receiving each codeword. In one embodiment, syndrome values may be updated based on previous syndrome values and corrected data. Thus, the syndrome calculation procedure may only be performed at the beginning of the decoding process. The syndromes corresponding to each of the codewords may be updated in subsequent iterations based on previous syndrome values.

Given the natural numbers m and t, a t-error correcting binary BCH code of length $n=2^m-1$ may be defined as: $c(x) \in GF(2)[x]$: deg $c(x) \leq n-1$, $c(\alpha)=c(\alpha^2)=c(\alpha^3)=\ldots=c(\alpha^{2t})=0$
where $\alpha \in GF(2^m)$ is a primitive element. In other words, it is the set of all binary polynomials of degree at most n−1 such that when these are treated as polynomials over $GF(2^m)$, they must have $\alpha, \alpha^2, \alpha^2, \ldots, \alpha^{2t}$ as their roots.

If c(x) is the transmitted codeword, e(x) is the error polynomial, and R(x)=c(x)+e(x) is the received codeword, then given that $\alpha, \alpha^2, \alpha^2, \ldots, \alpha^{2t}$ are roots of c(x), an initial component syndrome may be calculated as:

$$S_i = r(\alpha^{i+1}) = e(\alpha^{i+1})$$

for i=0, 1, . . . , 2t−1.

The error locator polynomial generator uses the syndromes $S_0, S_1, S_{2t-1}$ to generate the error location polynomial $\Lambda(x)$, which is defined as:

$$\Lambda(x) = \Pi_{i=1}^{v}(1-\alpha^{j_i}x)$$

Several methods exist in the art for finding the locator polynomial. For example, Berlekamp-Massey algorithm, Peterson's algorithm, and the like. The roots of the error locator polynomial (i.e., $j_0, j_1, j_v$ in the equation above) indicate the locations of the errors, so finding the roots of the error locator polynomial corresponds to finding the locations of the errors in a corresponding codeword.

Roots of the error location polynomial are usually found using Chien search. For binary symbols, once the error locations have been identified, correction simply involves flipping the bit at each identified error location. For non-binary symbols, the error magnitude needs to be calculated, for example, using Forney Algorithm, to find out the magnitude of the correction to be made.

Figure 4:
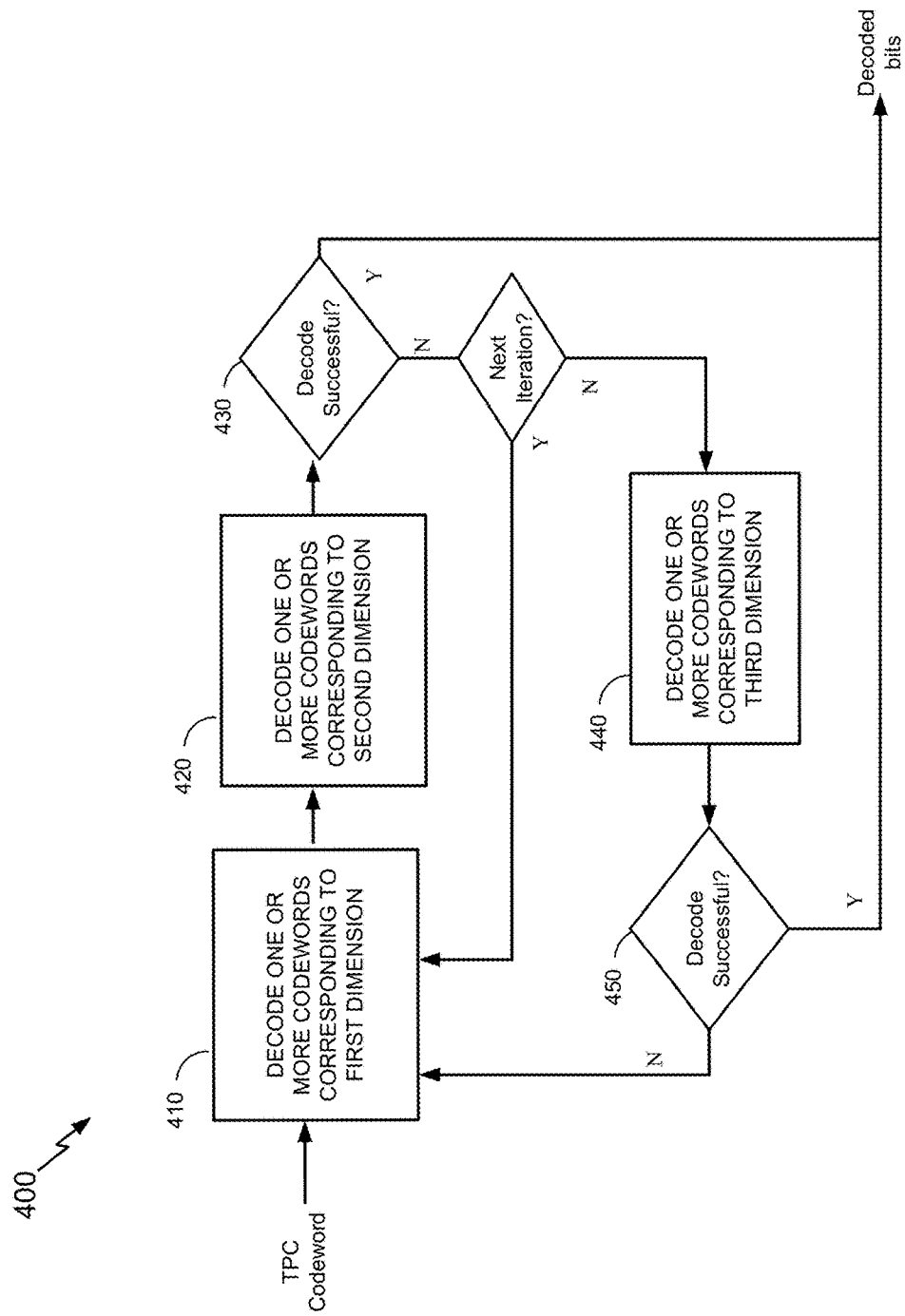
FIG. 4 illustrates an example three-dimensional TPC decoder, in accordance with certain embodiments of the present disclosure.

In general, a TPC decoder may perform BCH decoding on one or more of the row constituent codes and/or column constituent codes iteratively to generate a correct TPC codeword. FIG. 4 illustrates an example multi-dimensional TPC decoder 400, in accordance with certain embodiments of the present disclosure. The decoder receives a TPC codeword. At 410, the TPC decoder decodes one or more codewords corresponding to first dimension constituent code (e.g., row codeword) in the TPC codeword. As an example, for the TPC codeword as illustrated in FIG. 2, the decoder may decode one or more of the N row codewords. In one example, if each of the row constituent codewords is a BCH codeword, the TPC decoder performs BCH decoding on each of the row codewords.

In general, the TPC decoder may include any number of BCH decoders, without departing from the teachings of the present disclosure. As an example, depending on throughput and size requirements of a the TPC decoder, the TPC decoder may utilize a single BCH decoder to decode the N row codewords sequentially. Alternatively, the TPC decoder may include N BCH decoders that run in parallel to decode N row codewords in parallel. In another embodiment, the TPC decoder may include K BCH decoders, 1<K<N that run in parallel. The TPC decoder may utilize the K decoders one or more times to decode some or all the row codewords. In one example, N=30 and K=2.

At 420, the decoder may decode one or more codewords corresponding to the second dimension constituent code. For example, the decoder may decode one or more of the M column codewords. In one example, if each of the column codewords is a BCH codeword, the TPC decoder performs BCH decoding on each of the column codewords. At 430, the decoder checks if decoding has been successful or not. If yes, the decoding stops and the decoder outputs the decoded bits. If the TPC decoding has not been successful (e.g., the decoder did not converge to a correct codeword), the TPC decoder may iteratively perform decoding on the first dimension and/or second dimension codewords to correct errors. Alternatively at 440, the TPC decoder may decode one or more codewords corresponding to the third dimension. At 450, the TPC decoder checks if the decoding has been successful or not. If yes, the decoded bits are output from the decoder. If the decoding process has not been successful, the TPC decoder may perform another round of decoding on the first, second and third dimensions of the decoder to find a correct codeword. If the decoder reaches a maximum number of iterations, the decoding process may stop even if a correct codeword is not found. Without loss of generality, the TPC decoder in FIG. 4 has three dimensions. However, the TPC decoder, in general, may include any number of dimensions without departing from the teachings of the present disclosure.

Figure 5:
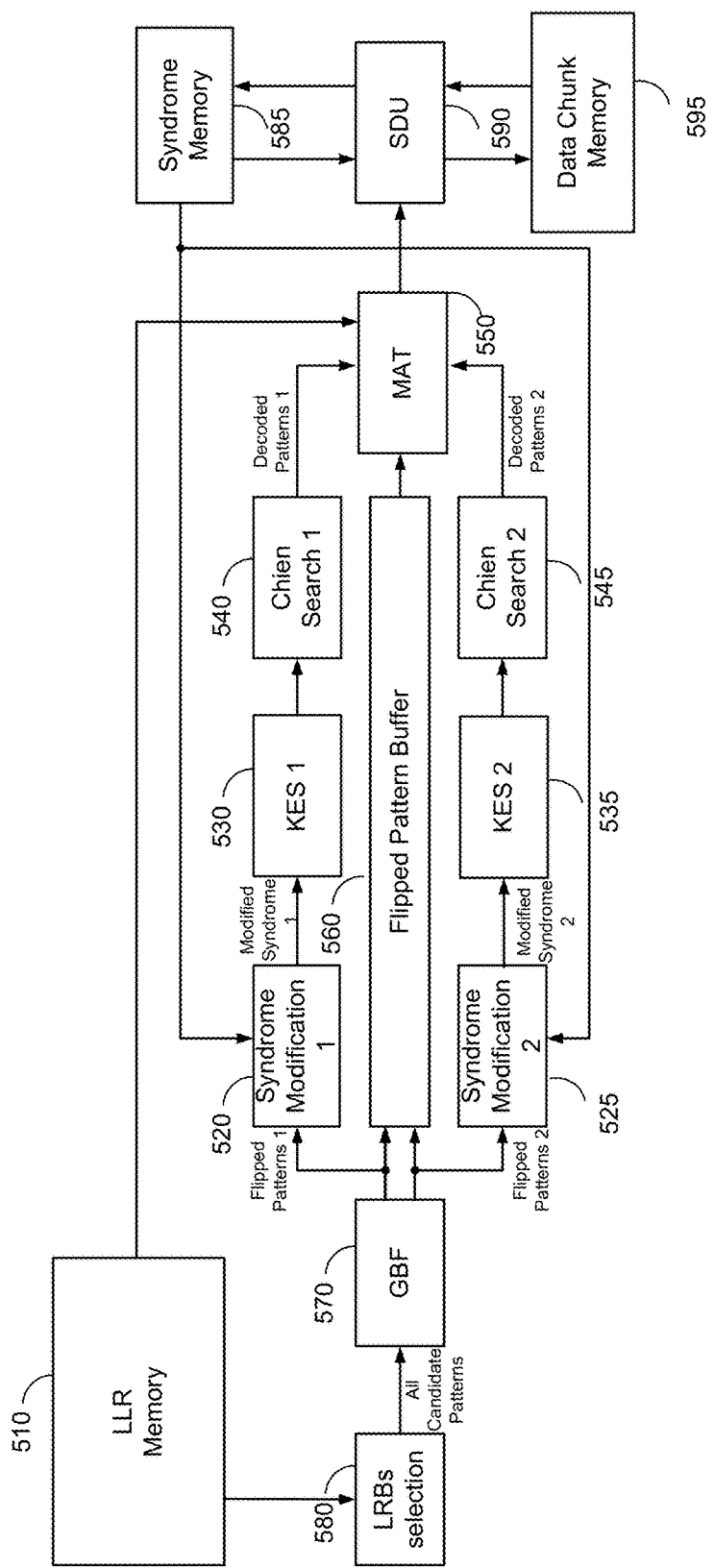
FIG. 5 illustrates an example high-level block diagram of a TPC soft decoder, in accordance with certain embodiments of the present disclosure.

FIG. 5 illustrates an example high-level block diagram of a TPC soft decoder, in accordance with certain embodiments of the present disclosure. In this example, syndrome update-based decoders are utilized. However, in general, any other type of soft decoder for any class of codes could be used without departing from the teachings of the present disclosure.

As illustrated, the decoder includes LLR memory block 510, syndrome modification blocks 520 and 525, key equation solver (KES) blocks 530 and 535, Chien search blocks 540 and 545, miscorrection avoidance block 550, syndrome memory 585, syndrome data update (SDU), general bit flipping (GBF) block 570, least reliable bit (LRB) selection block 580 and data chunk memory 595. It should be noted that any of the blocks shown in FIG. 5 could be eliminated and/or modified without departing from the teachings of the present disclosure.

In one embodiment, the LRB selection block 580 selects L least reliable bits based on received LLR values from the bits in the codeword. For example, the LRB selection block may select 10 reliable bits out of 50 received bits. The GBF block 570 may select S bits (S=1, ..., L) among the L bits to flip. In one example, the GBF block 570 may generate $\Sigma_{i=1}^{i=S} C_i^L$ flipped patterns. As an example, if L=5, S=3, The GBF selects 10 patterns.

In the example TPC soft decoder shown in FIG. 5, two BCH decoders run in parallel. The first BCH decoder includes syndrome modification block 520, KES block 530, Chien search block 540. The second BCH decoder includes syndrome modification block 525, KES block 535, and Chien search block 545. Therefore, the GBF block 570 generates two flipped patterns each time. It should be noted that any number of serial and/or parallel BCH decoders could be used in the TPC soft decoder, without departing from the teachings of the present disclosure. In case of P parallel decoders, the GBF block may generate P flipped patterns each time. The P flipped patterns may all be different from each other, or some of them may be similar, without departing from the teachings of the present disclosure.

The KES block 530 receives updated syndrome values that are modified based on the flipped patterns and finds error locator polynomial. Chien search 540 is then applied to find roots of error locator polynomial and generate decoded patterns.

In one embodiment, a MAT block 550 is used to reduce the probability of miscorrection by comparing the flipped and decoded patterns with LLR values. If the MAT block 550 detects a miscorrection, the decoded pattern is declared to be in error. If the MAT block does not detect a miscorrection (e.g., MAT condition is passed), the data and syndrome values will be updated according to the flipped and decoded patterns. In one embodiment, updated data value may be written in data chunk memory 595 and updated syndrome value may be written in syndrome memory 585. An example decoding flow chart corresponding to the TPC soft decoder is illustrated in FIG. 6.

Figure 6:
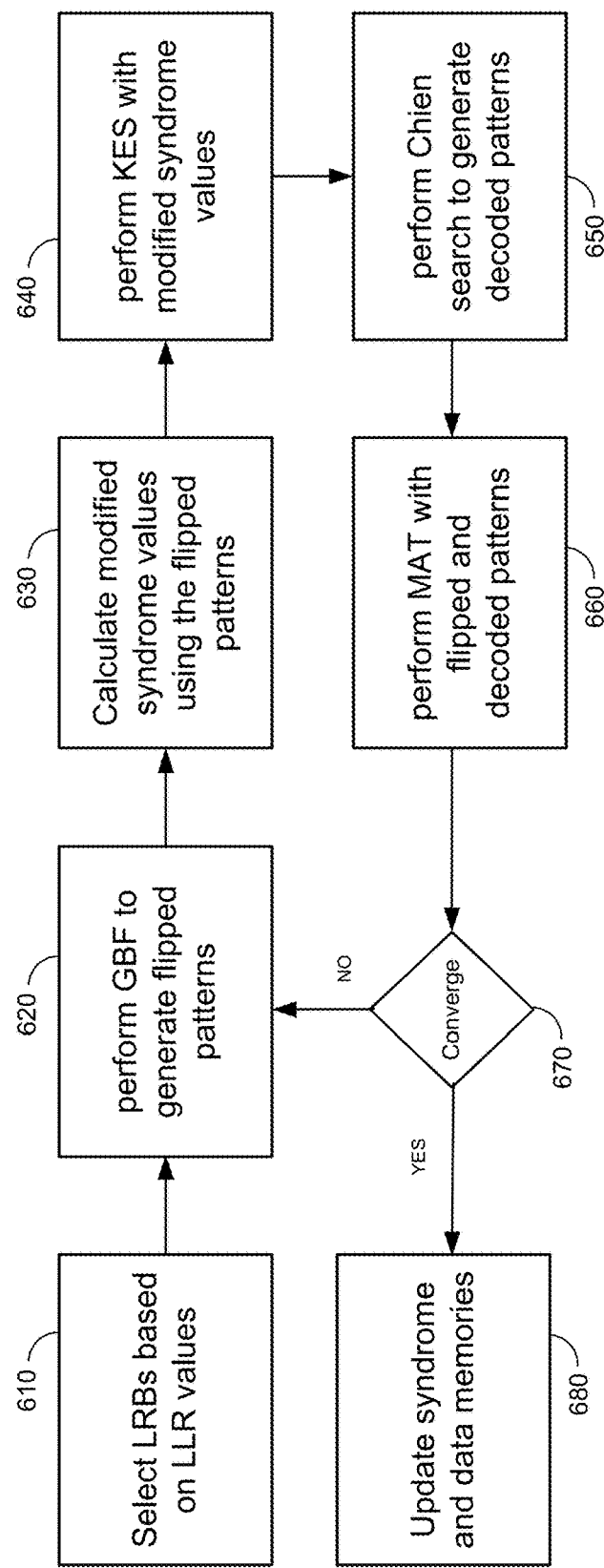
FIG. 6 illustrates example decoding operations that can be performed to decode a TPC codeword, in accordance with certain embodiments of the present disclosure.

FIG. 6 illustrates example decoding operations that can be performed by a device to decode a TPC codeword, in accordance with certain embodiments of the present disclosure. As illustrated, at 610, the device chooses a plurality of least reliable bits based on the LLR values. at 620, the device generates a one or more flipped patterns using the GBF block 570. At 630, the device calculates modified syndrome values based on the one or more flipped patterns. At 640, the device executes key equation solver using the modified syndrome values to find error locator polynomial. At 650, the device performs Chien search to generate one or more decoded patterns. At 660, the device performs miscorrection avoidance thresholding with flipped and decoded patterns. At 670, the device checks if the result of the MAT block indicates a correct codeword. If yes, the device updates the syndrome memory and the data memory. If the MAT does not indicate a correct codeword, the device generates another set of flipped patterns using step 620. In one example, the device may utilize a different set of flipped patterns compared to the previous flipped patterns to execute another iteration of decoding. The device may change any of the decoding parameters in the new iteration without departing from the teachings of the present disclosure.

Traditionally, the least reliable bits (LRBs) are selected by sorting all the received data. However, sorting the received data is expensive in hardware and may have a large latency if size of the codeword is large. Certain embodiments use an efficient method for selecting the least reliable bits. In one example, the least reliable bits are selected by comparing LLR values corresponding to one or more bits of the received data with a predetermined LLR threshold value. It should be noted the proposed method is not limited to decoding TPC codes and in general, can be used in any decoder that uses list decoding methods to select a number of candidates out of a plurality of candidates.

In one embodiment, the decoder may include one or more threshold LLR values. For example, the decoder may include three LLR threshold values t1, t2 and t3, in which t1<t2<t3. The decoder may first compare the received LLR values with the first threshold t1 to select N1 least reliable bits. If the number of selected least reliable bits (e.g., N1) is smaller than L, the decoder may then compare the received LLR values with a larger threshold value (e.g., the second threshold t2) to select more of the least reliable bits. In general, L represents the number of least reliable bits that the decoder intends to select.

Figure 7:
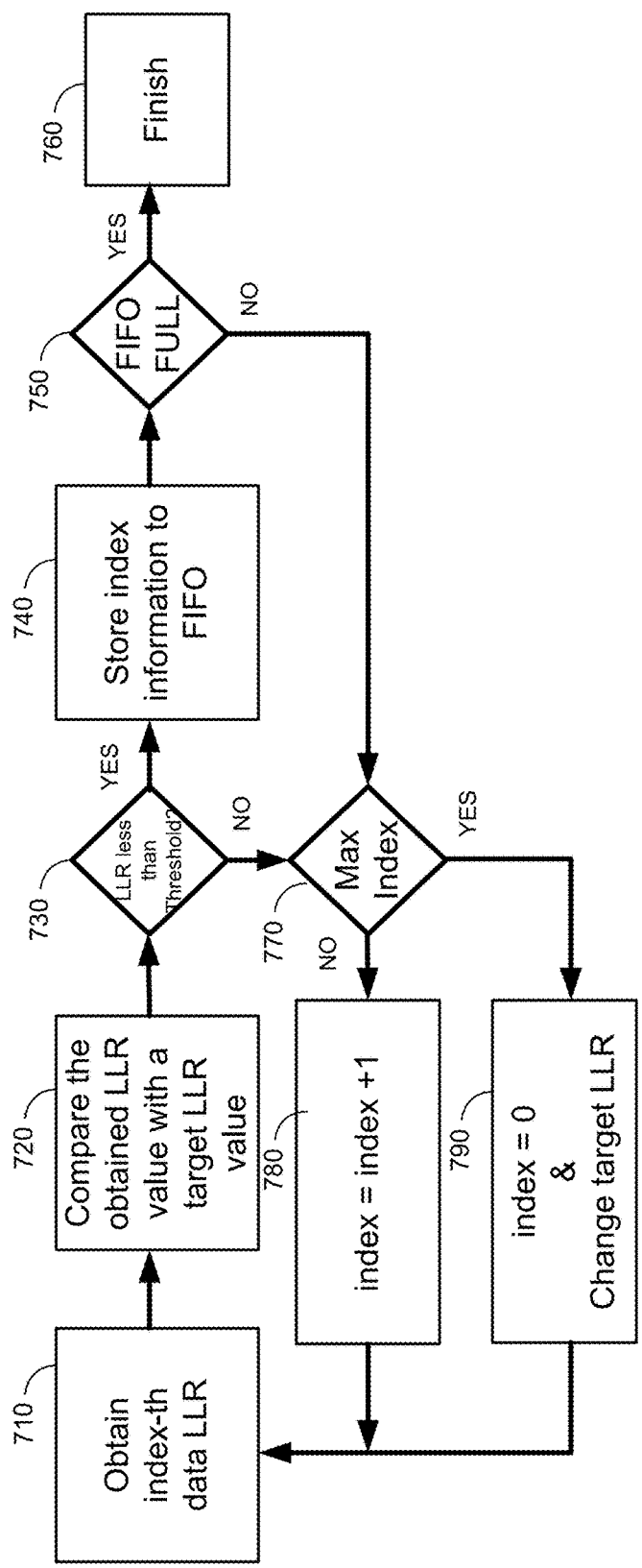
FIG. 7 illustrates an example flow chart for selecting L least reliable bits, in accordance with certain embodiments of the present disclosure.

FIG. 7 illustrates an example flow chart for selecting L least reliable bits, in accordance with certain embodiments of the present disclosure. It should be noted that although the flow chart illustrates the serial comparison case, the proposed method can be applied to semi-serial and/or parallel comparison without departing from the teachings of the present disclosure. At 710, the decoder obtains one or more LLR values corresponding to one or more data bits. As an example, the decoder receives an LLR value corresponding to the bit in the location equal to parameter index. At 720, the decoder compares the received LLR value with a target LLR value (e.g., a target threshold value). At 730, the decoder determines if the received LLR value is equal to or less than the target threshold value. If yes, the decoder determines that the corresponding bit is a good candidate for "least reliable bits." At 740, the decoder stores the index information into a first in first out (FIFO) buffer. At 750, the decoder checks whether it has found enough least reliable bits or not. In one example, the decoder may check if the FIFO is full or not. Any other method may also be used to check if enough bits are selected. For example, the decoder may want to select 10 least reliable bits. As soon as the decoder finds the $10^{th}$ bit, the decoder may stop the process of least reliable bit selection (e.g., at 760) and move to the next step of the TPC decoding process (e.g., the bit flipping process).

If the decoder determines that more least reliable bits are still needed to be selected (e.g., number of selected LSBs<L), at 770, the decoder checks to see if it has searched all the bits in the codeword or not. If no, at 780, the decoder increases the index value by one and checks the next bit. At 790, if the decode has checked all the received bits and has not yet found enough least reliable bits (e.g., meaning that the threshold has been large), the decoder sets the target LLR threshold value to a smaller value and searches the received bits to see if it can find more least reliable bits. In one embodiment, the decoder may set index value to zero and start searching from the LLR values corresponding to first bit of the received message. In general, the decoder may start the search process from any other bit location in the codeword, without departing from the teachings of the present disclosure.

In one embodiment, when the decoder starts comparing the LLR values corresponding to the obtained bits with a smaller threshold, the decoder may only add the indexes that are not already in the FIFO to the list of selected least reliable bits.

In one embodiment, the general bit flipping block 570 is utilized to generate the flipped patterns based on the selected LRBs. In general, if L LRBs are selected, $2^L$ flipped patterns will be generated, in which L represents number of least reliable bits. Performance of the decoding process improves with increasing values of L. In one embodiment, if a miscorrection protection scheme is used in the decoder, an increase in the number of least reliable bits improves the performance of the decoder. It should be noted that increasing L, may result in an increase in the number of flipped patterns, which may increase hardware complexity.

The general bit flipping scheme as described herein may generate a predefined number of flipped patterns. In general, the number of flipped patterns may be independent from number of least reliable bits L. In one embodiment, the flipped patterns may be generated by flipping at most S of the bits to generate each flipped pattern. The total number of flipped patterns can be written as follows:

$$\sum_{i=1}^{i=s} C_i^L$$

in which $C_i^L$ represents choosing i elements from a set of L elements (e.g., L Choose i).

In one embodiment, a general bit flipping block may be designed in hardware based on a $C_i^L$ flipping block. As an example, the $C_i^L$ flipping block may flip i out of L LRBs and find all the combinations. In one embodiment, by accessing $C_i^L$ flipping block S times and changing value of i, one by one from 1 to S, the general bit flipping block can go through all the combination of flipped patterns.

Figure 8:
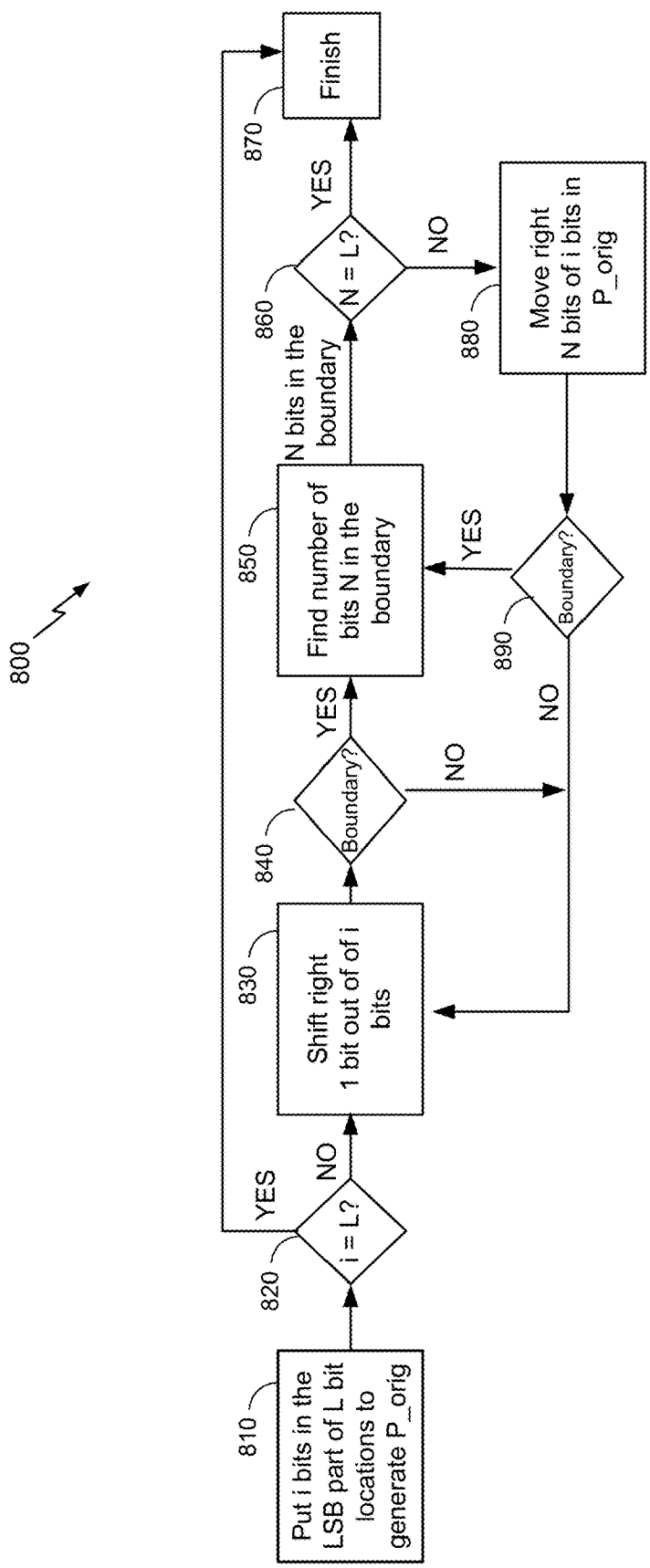
FIG. 8 illustrates an example flowchart for performing general bit flipping by a device, in accordance with certain embodiments of the present disclosure.

FIG. 8 illustrates an example flowchart for performing general bit flipping 700 by a device, corresponding to the GBF block 570 as shown in FIG. 5, in accordance with certain embodiments of the present disclosure. In this example, $C_i^L$ bits are flipped to generate flipped patterns. At 810, the device puts i bits in least significant bits out of L bit location to generate an original bit pattern $P_{orig}$. As an example, if i=3 and L=5, the device generates $P_{orig}$=11100. At 820, the device checks if i is equal to L. If yes, the device declares that all the bit patterns are found and stops this procedure. If I is smaller than L, at 830 the device shifts one bit out of the i bits in $P_{orig}$ to generate another pattern. As an example, the device generates pattern 11010. At 840, the device checks if the bit has reached the boundary. In the above, example, the answer is No. In this case, the device at 830, generates another pattern (e.g., 11001). Since one of the bits has reached the boundary, at 850, the device finds number of bits at the boundary (e.g., N). In the above example, only one of the bits has reached the rightmost boundary. Therefore, N=1. At 860, the device checks if N is equal to L or not. If yes, at 870, the device declares that it has found all the bit patterns and stops this procedure. If N is smaller than L, at 880, the device shifts N bits out of the i bits towards right. And at 890, the device checks if the bits have reaches the boundary. In this example, the device generates patterns 10101 and 10011 at steps 830 through 850. In the latter case N=2, then the device moves two bits to the right from the $P_{orig}$ to generate 10110 at step 880. The device continues this procedure to generate other patterns (e.g., 01011, 00111, 01101 and 01110).

In general, performance of Chase decoding may be improved by increasing maximum number of flipped bits in the bit flipping patterns. However, increasing number of flipped bits may increases probability of miscorrection. In one embodiment, to reduce miscorrection probability, a miscorrection avoidance threshold is applied to the decoded patterns. In one example, a miscorrection metric may be defined for the decoder. As an example, the miscorrection metric may be generated by generating a summation of the difference between the received LLRs corresponding to each bit and the corresponding decoded bit in the decoded pattern. It should be noted that any other metric based on the received LLR and/or the decoded bits may be used for miscorrection avoidance without departing from the teachings of the present disclosure.

The miscorrection avoidance threshold may then be compared with a miscorrection metric to decide whether or not the decoder has miscorrected any of the bits.

Figure 9:
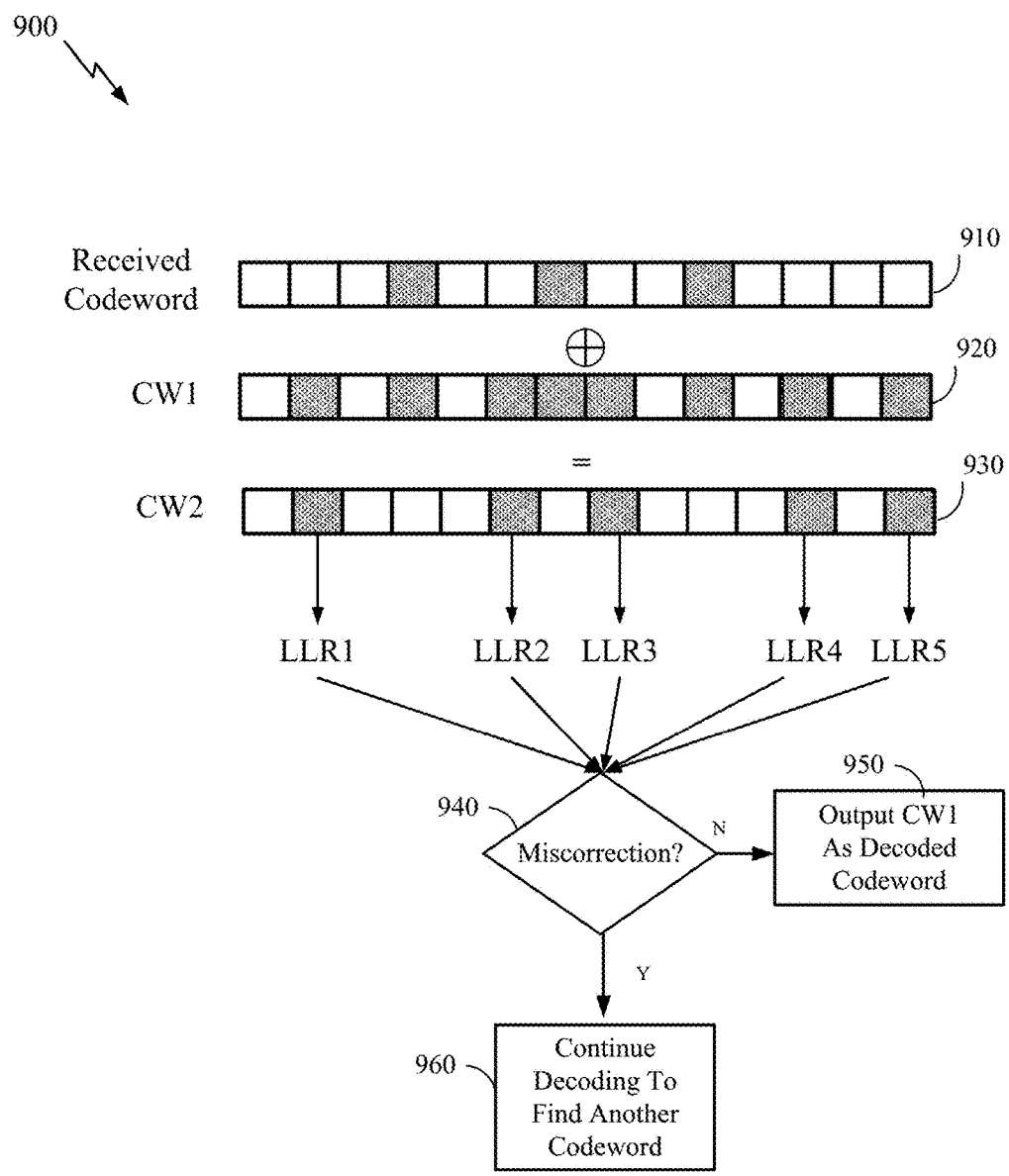
FIG. 9 illustrates a simple example for a novel miscorrection avoidance technique, in accordance with certain embodiments of the present disclosure.

FIG. 9 illustrates a simple example for the miscorrection avoidance thresholding (e.g., MAT) technique as described herein. As illustrated, the received codeword 910 is compared with another codeword that is a result of flipping and/or decoding (e.g., CW1 920) to generate codeword SW2 930. Codeword SW2 shows locations in the received codeword that are modified by flipping and/or decoding. The LLR values corresponding to each location that is modified in CW2 (e.g., LLR values corresponding to a given bit in the received codeword whose corresponding bit value is different in CW1 are selected and added together, as follows:

$$M = \sum_{i=1}^{k} |LLR_k|$$

in which M represents a miscorrection metric, k represents number of bits whose corresponding value is different between the two codewords, and LLR represents reliability of a given bit in the received codeword. At block 940, the miscorrection metric is compared with a miscorrection threshold. In one embodiment, if M is larger than the miscorrection threshold, a miscorrection is declared and the decoder at 960 continues the decoding with another bit flipping pattern to find another codeword. If the miscorrection metric M is smaller than the miscorrection threshold, at 950, the device declares that no miscorrection has happened and outputs the codeword CW1 as the decoded codeword.

In general, the decoding is successful only if the summation of the difference values (e.g., the miscorrection metric M) is smaller than the threshold value. In one embodiment, the decoded codeword is passed to the MAT block for the summation and comparison procedure. In general, there is no need to pass the flipped patterns to MAT block. In one embodiment, MAT block works based on the decoded codeword and the received codeword. Received codeword is the codeword that is sent to Chase decoder. In one embodiment, XOR of the received codeword and the decoded codeword will identify the bits that are flipped by Chase decoder. For example, the bits that are found through XOR operation, will have both flipped patterns as well as BCH decoder flipping. In one embodiment, LLR at these mismatched locations is summed in absolute value and compared with the threshold value.

In general, value of the miscorrection threshold can be defined based on the channel conditions and/or other parameters of the system. In one embodiment, value of the MAT threshold is obtained through simulations. For example, for n=1023, k=993, m=10, t=3, BCH/Chase decoding can be done for multiple codewords using AWGN channel. For decoded codewords, sum of miscorrection metric at flipped locations (L_sum) can be calculated. A histogram may then be plotted based on L_sum conditioned on the fact that the codeword is miscorrected or not. In simulations, it is observed that histograms for miscorrected and corrected codewords are almost disjoint except some minor tail region. In one embodiment, value of L_sum is selected such that the histogram for miscorrected and histogram for corrected codewords are roughly separated. In one embodiment, it is observed that value of the miscorrection threshold has minimal variations for different noise variances of AWGN channels that are in range of interest.

In general, there may be a tradeoff in performance of the decoder depending on the miscorrection avoidance threshold value. If a lower value is used as the miscorrection threshold, the device may detect all of the miscorrections and avoid them. However, the decoder may not allow correcting some codewords which are decoded correctly but do not satisfy the miscorrection threshold check. If a higher value is considered for the miscorrection threshold, the decoder may correctly decoded codewords, but may not be able to detect all the miscorrections for some of the codewords, which may not be desirable.

Figure 10:
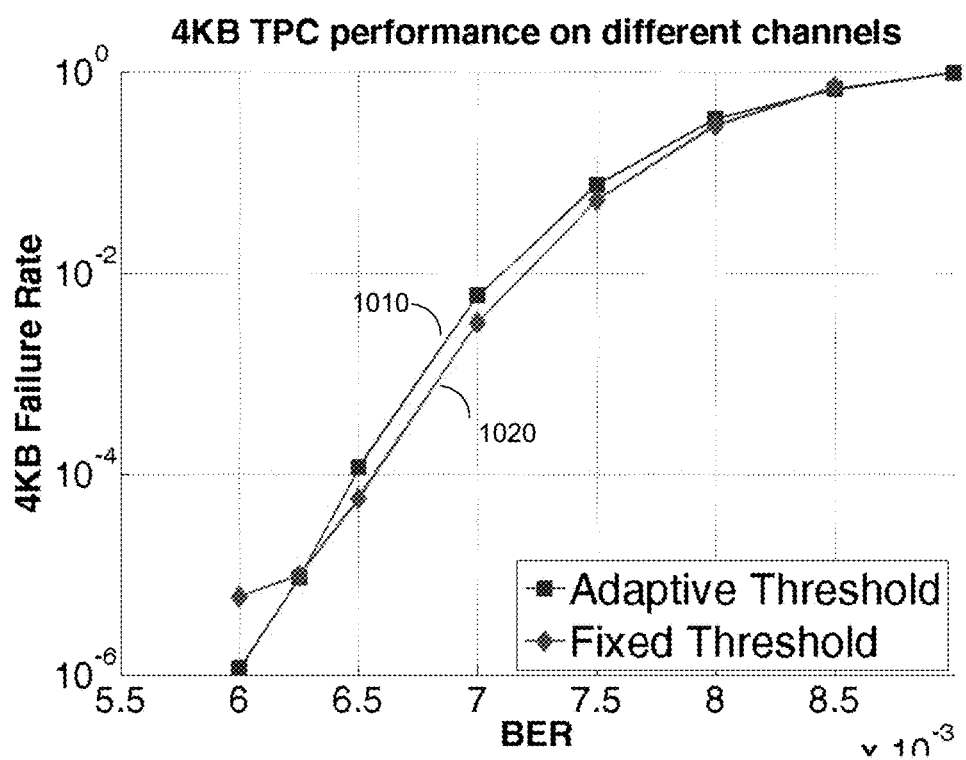
FIG. 10 illustrates performance comparison of TPC decoder with adaptive miscorrection avoidance threshold and fixed miscorrection avoidance threshold during iterative Chase decoding, in accordance with certain embodiments of the present disclosure.

In one embodiment, a lower value of miscorrection threshold may be used in the early decoding iterations and as the decoding progresses a higher value of miscorrection threshold can be used. This adaptive thresholding method provides gains in the higher SNR regimes as shown in FIG. 10. In one embodiment, the values of adaptive miscorrection thresholds are determined according to the desired channel.

In general, LLR values that are lower correspond to the bits that are noisy, which are good candidates for being in error and would be flipped during decoding. A lower value of threshold means that the MAT is strict in terms of avoiding miscorrections because L_sum should be smaller than miscorrection threshold for allowing flips. It is preferable to avoid miscorrections in the start of decoding since there are usually more bits in error at the start of the decoding. Therefore, in one embodiment, the threshold is chosen conservatively at an early stage of decoding. As decoding progresses, errors are removed. Therefore, a lenient threshold (e.g., higher value of threshold can be used in the decoding. As an example, a bit in error having an LLR value equal to 1.4 with initial threshold equal to one, will not get flipped until the threshold is increased with iterations and becomes greater than 1.4. In one example, a lower threshold value (e.g., one) may be used at the beginning of decoding and a higher threshold value (e.g., 1.5) can be used after four decoding iterations.

The TPC soft decoder architecture presented herein utilizes a modified version of Chase decoding, which is more efficient in hardware. As described earlier, the decoder utilizes one or more optimization methods (least reliable bits selection, general bit flipping and/or miscorrection avoidance thresholding) to provide better error correcting performance with minimal increase in hardware complexity.

FIG. 10 illustrates performance comparison of TPC decoder with adaptive miscorrection avoidance threshold and fixed miscorrection avoidance threshold during iterative Chase decoding. As illustrated, curve 1010 shows failure rate of a first system that uses adaptive miscorrection avoidance thresholding. Curve 1020 shows failure rate of a second system that uses fixed miscorrection threshold value. The failure rate corresponds to number of miscorrected messages that are not identified by the MAT technique in decoding 4 KB of data. As illustrated, utilizing adaptive threshold values results in better performance.

Figure 11:
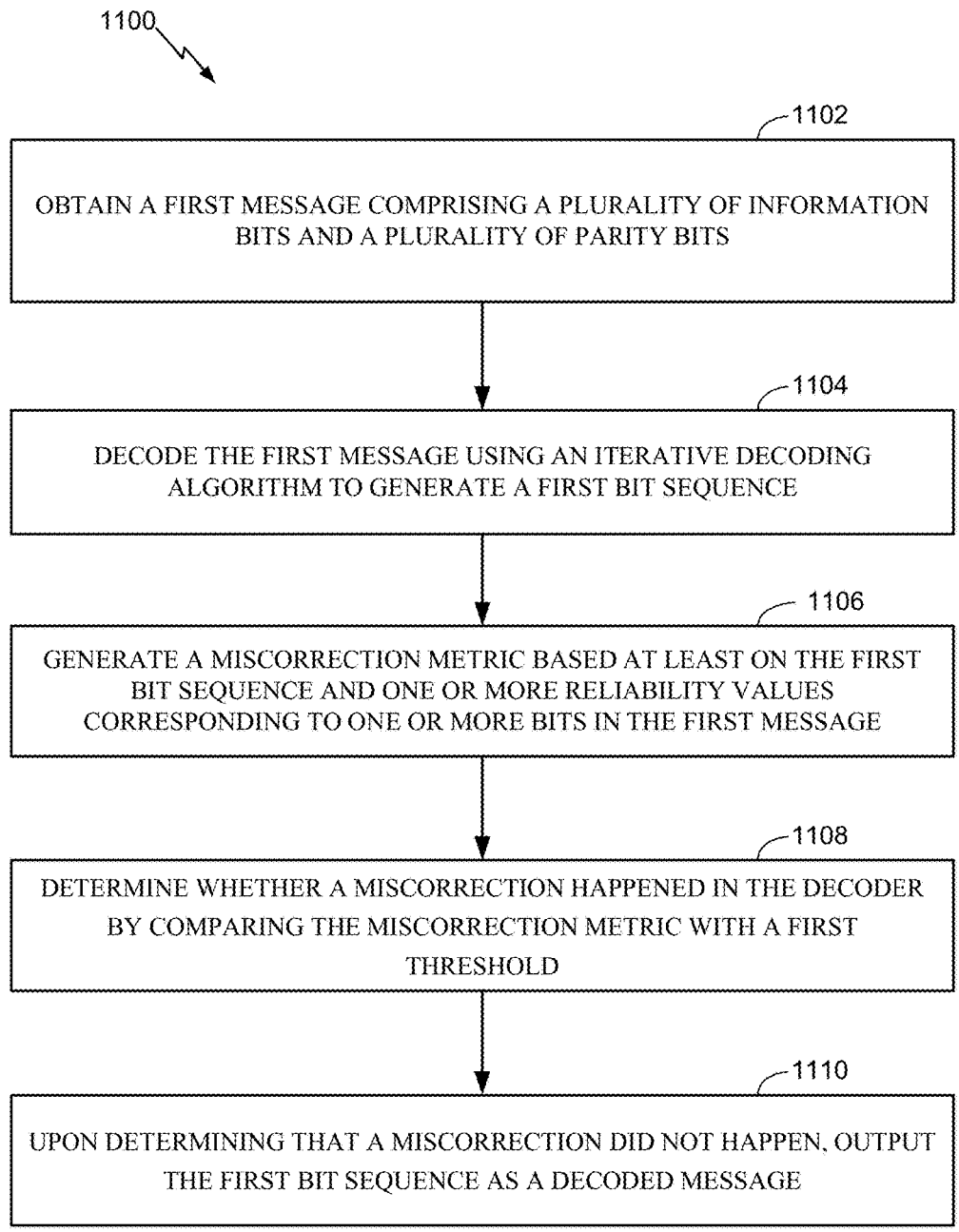
FIG. 11 illustrates example operations that may be performed by a device to decode a TPC codeword, in accordance with certain embodiments of the present disclosure.

FIG. 11 illustrates example operations that may be performed by a device to decode a TPC codeword, in accordance with certain embodiments of the present disclosure. At 1110, the device obtains a first message comprising a plurality of information bits and a plurality of parity bits. At 1120, the device decodes the first message using an iterative decoding algorithm to generate a first bit sequence. At 1130, the device generates a miscorrection metric based at least on the first bit sequence and one or more reliability values corresponding to one or more bits in the first message. At 1140, the device determines whether a miscorrection happened in the decoder by comparing the miscorrection metric with a first threshold. At 1150, upon determining that a miscorrection has not happened, the device outputs the first bit sequence as a decoded message.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

Figure 12:
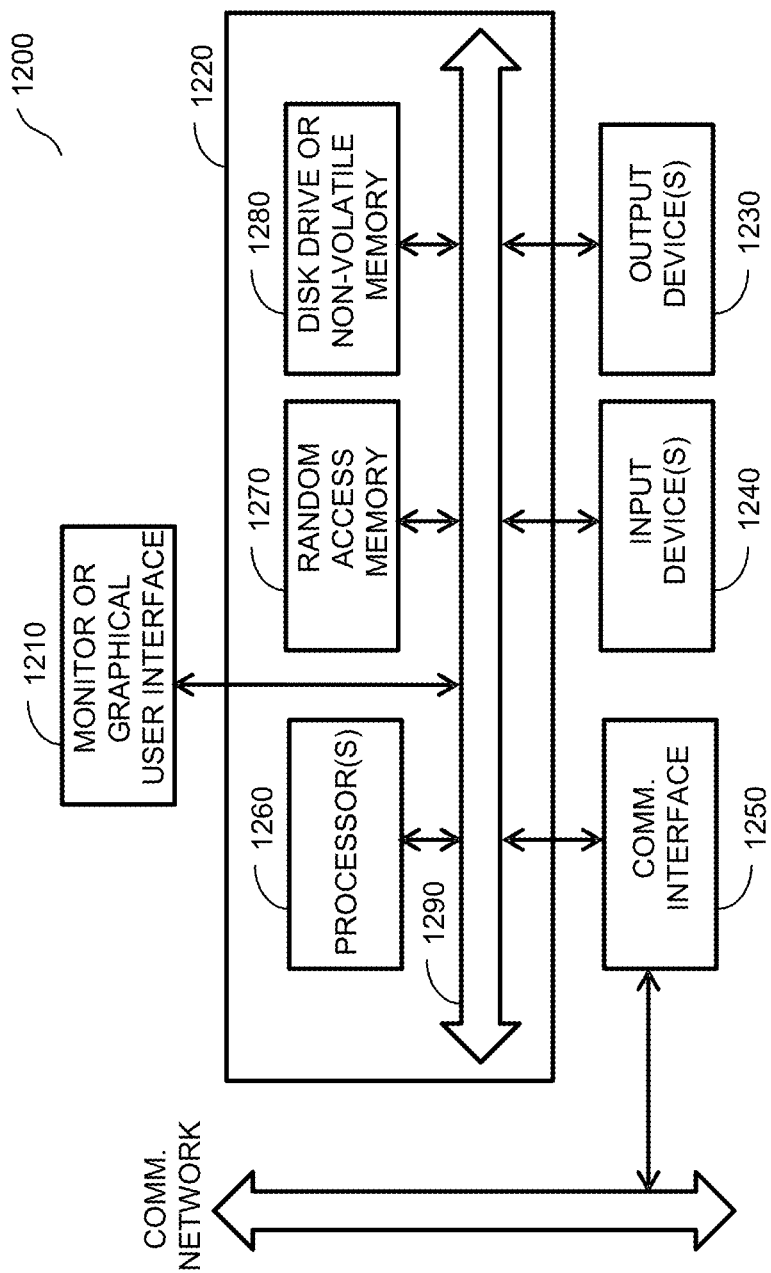
FIG. 12 describes one potential implementation of a device which may be used to decode a TPC codeword, according to one embodiment.

FIG. 12 describes one potential implementation of a device which may be used to decode a codeword, according to certain embodiments. FIG. 12 is merely illustrative of an embodiment incorporating the present invention and does not limit the scope of the invention as recited in the claims. One of ordinary skill in the art would recognize other variations, modifications, and alternatives. In one embodiment, computer system 1200 typically includes a monitor 1210, a computer 1220, user output devices 1230, user input devices 1240, communications interface 1250, and the like.

As shown in FIG. 12, computer 1220 may include a processor(s) 1260 that communicates with a number of peripheral devices via a bus subsystem 1290. These peripheral devices may include user output devices 1230, user input devices 1240, communications interface 1250, and a storage subsystem, such as random access memory (RAM) 1270 and disk drive 1280.

User input devices 1230 include all possible types of devices and mechanisms for inputting information to computer system 1220. These may include a keyboard, a keypad, a touch screen incorporated into the display, audio input devices such as voice recognition systems, microphones, and other types of input devices. In various embodiments, user input devices 1230 are typically embodied as a computer mouse, a trackball, a track pad, a joystick, wireless remote, drawing tablet, voice command system, eye tracking system, and the like. User input devices 1230 typically allow a user to select objects, icons, text and the like that appear on the monitor 1210 via a command such as a click of a button or the like.

User output devices 1240 include all possible types of devices and mechanisms for outputting information from computer 1220. These may include a display (e.g., monitor 1210), non-visual displays such as audio output devices, etc.

Communications interface 1250 provides an interface to other communication networks and devices. Communications interface 1250 may serve as an interface for receiving data from and transmitting data to other systems. Embodiments of communications interface 1250 typically include an Ethernet card, a modem (telephone, satellite, cable, ISDN), (asynchronous) digital subscriber line (DSL) unit, FireWire interface, USB interface, and the like. For example, communications interface 1250 may be coupled to a computer network, to a FireWire bus, or the like. In other embodiments, communications interfaces 1250 may be physically integrated on the motherboard of computer 1220, and may be a software program, such as soft DSL, or the like.

In various embodiments, computer system 1200 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1220 includes one or more Xeon microprocessors from Intel as processor(s) 1260. Further, one embodiment, computer 1220 includes a UNIX-based operating system.

RAM 1270 and disk drive 1280 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1270 and disk drive 1280 may be configured to store the basic programming and data constructs that provide the functionality of the present invention.

Software code modules and instructions that provide the functionality of the present invention may be stored in RAM 1270 and disk drive 1280. These software modules may be executed by processor(s) 1260. RAM 1270 and disk drive 1280 may also provide a repository for storing data used in accordance with the present invention.

RAM 1270 and disk drive 1280 may include a number of memories including a main random access memory (RAM) for storage of instructions and data during program execution and a read only memory (ROM) in which fixed non-transitory instructions are stored. RAM 1270 and disk drive 1280 may include a file storage subsystem providing persistent (non-volatile) storage for program and data files. RAM 1270 and disk drive 1280 may also include removable storage systems, such as removable flash memory.

Bus subsystem 1290 provides a mechanism for letting the various components and subsystems of computer 1220 communicate with each other as intended. Although bus subsystem 1290 is shown schematically as a single bus, alternative embodiments of the bus subsystem may utilize multiple busses.

FIG. 12 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for decoding, comprising:
   obtaining a first message comprising a plurality of information bits and a plurality of parity bits from a memory via a channel;
   decoding, using a Chase decoder the first message using an iterative decoding algorithm to generate a first bit sequence;
   identifying locations of bits flipped by the Chase decoder based on the first bit sequence and the first message, the locations of the bits flipped corresponding to a first bit flip pattern;
   generating a miscorrection metric based on reliability values corresponding to bits in the first message at the locations of the bits flipped; and performing a miscorrection avoidance thresholding (MAT) decoding procedure by:
determining whether a miscorrection happened in an iteration of the iterative decoding algorithm by comparing the miscorrection metric with an adaptive threshold, wherein the adaptive threshold has a value that changes and is defined based on a counter of the iteration, and wherein the value increases with an increase to the counter;
upon determining that the miscorrection did happen based at least in part on the comparing of the miscorrection metric with the adaptive threshold:
declaring a decoded pattern to constitute an error
performing an additional decoding iteration by the Chase decoder of the first message based on a second bit flip pattern; and
increasing the value of the adaptive threshold; and
upon determining that the miscorrection did not happen, outputting the first bit sequence as a decoded message without repeating the decoding of the first message based on the second bit flip pattern.

2. The method of claim 1, wherein the decoding the first message comprises:
selecting a first set of least reliable bits from the first message by comparing one or more reliability values corresponding to one or more bits in the first message with a first reliability threshold;
generating one or more bit flipping patterns based on the first set of least reliable bits; and
generating the first bit sequence using the first message and the one or more bit flipping patterns.

3. The method of claim 2, wherein if a number of bits in the first set of least reliable bits is smaller than a predefined value, selecting a second set of least reliable bits by comparing the one or more reliability values with a second reliability threshold, wherein the second threshold is greater than the first threshold.

4. The method of claim 2, wherein each bit flipping pattern comprises a maximum number of flipped bits which is smaller than a number of least reliable bits in the first message.

5. The method of claim 1, wherein the first message corresponds to a turbo product code (TPC) codeword comprising two or more constituent codes, wherein each constituent code corresponds to a class of error correcting codes.

6. An apparatus for decoding, comprising:
a memory;
at least one processor coupled to the memory, the at least one processor configured to:
obtain a first message comprising a plurality of information bits and a plurality of parity bits from a memory via a channel;
decode the first message using an iterative decoding algorithm to generate a first bit sequence;
identify locations of bits flipped by the decoding based on the first bit sequence and the first message, the locations of the bits flipped corresponding to a first bit flip pattern;
generate a miscorrection metric based on reliability values corresponding to bits in the first message at the locations of the bits flipped;
determine whether a miscorrection happened in an iteration of the iterative decoding algorithm by comparing the miscorrection metric with an adaptive threshold, wherein the adaptive threshold has a value that changes and is defined based on a counter of the iteration, and wherein the value increases with an increase to the counter;
upon determining that the miscorrection did happen based at least in part on the comparing of the miscorrection metric with the adaptive threshold:
declaring a decoded pattern to constitute an error, and
performing, by using the iterative decoding algorithm, an additional decoding iteration of the first message based on a second bit flip pattern and on an increase to the value of the adaptive threshold; and
upon determining that the miscorrection did not happen, output the first bit sequence as a decoded message without repeating the decoding of the first message based on the second bit flip pattern.

7. The apparatus of claim 6, wherein the processor is further configured to:
select a first set of least reliable bits from the first message by comparing one or more reliability values corresponding to one or more bits in the first message with a first reliability threshold;
generate one or more bit flipping patterns based on the first set of least reliable bits; and
generate the first bit sequence using the first message and the one or more bit flipping patterns.

8. The apparatus of claim 7, wherein the processor is further configured to select a second set of least reliable bits by comparing the one or more reliability values with a second reliability threshold if a number of bits in the first set of least reliable bits is smaller than a predefined value, wherein the second threshold is greater than the first threshold.

9. The apparatus of claim 7, wherein each bit flipping pattern comprises a maximum number of flipped bits which is smaller than a number of least reliable bits in the first message.

10. The apparatus of claim 6, wherein the first message corresponds to a turbo product code (TPC) codeword comprising two or more constituent codes, wherein each constituent code corresponds to a class of error correcting codes.

11. A non-transitory processor-readable medium for decoding, comprising processor-readable instructions configured to cause one or more processors to:
obtain a first message comprising a plurality of information bits and a plurality of parity bits from a memory via a channel;
decode the first message using an iterative decoding algorithm to generate a first bit sequence;
identify locations of bits flipped by the decoding based on the first bit sequence and the first message, the locations of the bits flipped corresponding to a first bit flip pattern;
generate a miscorrection metric based on reliability values corresponding to bits in the first message at the locations of the bits flipped;
determine whether a miscorrection happened in an iteration of the iterative decoding algorithm by comparing the miscorrection metric with an adaptive threshold, wherein the adaptive threshold has a value that changes and is defined based on a counter of the iteration, and wherein the value increases with an increase to the counter;
upon determining that the miscorrection did happen based at least in part on the comparing of the miscorrection metric with the adaptive threshold:

declaring a decoded pattern to constitute an error, and performing, by using the iterative decoding algorithm, an additional decoding iteration of the first message based on a second bit flip pattern and on an increase to the value of the adaptive threshold; and upon determining that the miscorrection did not happen, output the first bit sequence as a decoded message without repeating the decoding of the first message based on the second bit flip pattern.

12. The processor-readable medium of claim 11, wherein the processor-readable instructions are further configured to cause the one or more processors to:

select a first set of least reliable bits from the first message by comparing one or more reliability values corresponding to one or more bits in the first message with a first reliability threshold;

generate one or more bit flipping patterns based on the first set of least reliable bits; and generate the first bit sequence using the first message and the one or more bit flipping patterns.

13. The processor-readable medium of claim 12, wherein the processor-readable instructions are further configured to cause the one or more processors to: select a second set of least reliable bits by comparing the one or more reliability values with a second reliability threshold if a number of bits in the first set of least reliable bits is smaller than a predefined value, wherein the second threshold is greater than the first threshold.

14. The processor-readable medium of claim 12, wherein each bit flipping pattern comprises a maximum number of flipped bits which is smaller than a number of least reliable bits in the first message.

15. The processor-readable medium of claim 11, wherein the first message corresponds to a turbo product code (TPC) codeword comprising two or more constituent codes, wherein each constituent code corresponds to a class of error correcting codes.

* * * * *